United States Patent
Zhang

(10) Patent No.: US 10,002,938 B2
(45) Date of Patent: Jun. 19, 2018

(54) ATOMIC LAYER DEPOSITION OF SELECTED MOLECULAR CLUSTERS

(71) Applicant: STMicroelectronics, Inc., Coppell, TX (US)

(72) Inventor: John H. Zhang, Altamont, NY (US)

(73) Assignee: STMICROELECTRONICS, INC., Coppell, TX (US)

(*) Notice: Subject to any disclaimer, the term of this patent is extended or adjusted under 35 U.S.C. 154(b) by 0 days. days.

(21) Appl. No.: 14/464,604

(22) Filed: Aug. 20, 2014

(65) Prior Publication Data

US 2015/0053930 A1 Feb. 26, 2015

Related U.S. Application Data

(60) Provisional application No. 61/867,930, filed on Aug. 20, 2013.

(51) Int. Cl.
*H01L 21/8234* (2006.01)
*H01L 29/51* (2006.01)
(Continued)

(52) U.S. Cl.
CPC ............ *H01L 29/51* (2013.01); *C23C 14/048* (2013.01); *C23C 14/221* (2013.01); *H01L 21/02521* (2013.01); *H01L 21/02631* (2013.01); *H01L 21/285* (2013.01); *H01L 21/2855* (2013.01); *H01L 21/28088* (2013.01); *H01L 21/76831* (2013.01); *H01L 21/823418* (2013.01); *H01L 21/823814* (2013.01); *H01L 29/456* (2013.01);
(Continued)

(58) Field of Classification Search
CPC ........... H01L 21/8234; H01L 21/02521; H01L 21/02631; H01L 21/28088
USPC .......................................................... 257/29
See application file for complete search history.

(56) References Cited

U.S. PATENT DOCUMENTS 4,485,550 A 12/1984 Koeneke et al.
5,346,851 A 9/1994 Randall et al.
(Continued)

OTHER PUBLICATIONS

Correa, N. Mariano et al., "Preparation of AgBr Quantum Dots via Electroporation of Vesicles", Journal of the American Chemical Society, Jun. 23, 2000, vol. 122, pp. 6432-6434.
(Continued)

*Primary Examiner* — Douglas Menz
(74) *Attorney, Agent, or Firm* — Seed IP Law Group LLP

(57) ABSTRACT

Energy bands of a thin film containing molecular clusters are tuned by controlling the size and the charge of the clusters during thin film deposition. Using atomic layer deposition, an ionic cluster film is formed in the gate region of a nanometer-scale transistor to adjust the threshold voltage, and a neutral cluster film is formed in the source and drain regions to adjust contact resistance. A work function semiconductor material such as a silver bromide or a lanthanum oxide is deposited so as to include clusters of different sizes such as dimers, trimers, and tetramers, formed from isolated monomers. A type of Atomic Layer Deposition system is used to deposit on semiconductor wafers molecular clusters to form thin film junctions having selected energy gaps. A beam of ions contains different ionic clusters which are then selected for deposition by passing the beam through a filter in which different apertures select clusters based on size and orientation.

26 Claims, 10 Drawing Sheets

(51) Int. Cl.
| | |
|---|---|
| *H01L 21/02* | (2006.01) |
| *H01L 21/28* | (2006.01) |
| *H01L 29/45* | (2006.01) |
| *H01L 29/49* | (2006.01) |
| *H01L 21/8238* | (2006.01) |
| *H01L 21/285* | (2006.01) |
| *H01L 21/768* | (2006.01) |
| *C23C 14/04* | (2006.01) |
| *C23C 14/22* | (2006.01) |
| *H01L 29/66* | (2006.01) |

(52) U.S. Cl.
CPC ........ *H01L 29/4966* (2013.01); *H01L 29/517* (2013.01); *H01L 29/66545* (2013.01)

(56) References Cited

U.S. PATENT DOCUMENTS

| | | | |
|---|---|---|---|
| 5,923,046 | A | 7/1999 | Tezuka et al. |
| 5,960,319 | A | 9/1999 | Iwata et al. |
| 6,005,271 | A | 12/1999 | Hshieh |
| 6,042,345 | A | 3/2000 | Bishop et al. |
| 6,207,482 | B1 | 3/2001 | Shih et al. |
| 6,268,273 | B1 | 7/2001 | Kim et al. |
| 6,482,714 | B1 | 11/2002 | Hieda et al. |
| 6,518,625 | B1 | 2/2003 | Nishida et al. |
| 6,559,468 | B1 | 5/2003 | Kuekes et al. |
| 6,737,323 | B2 | 5/2004 | Mo |
| 6,780,742 | B1 | 8/2004 | Wasshuber |
| 7,019,333 | B1 | 3/2006 | Shields et al. |
| 7,172,980 | B2 | 2/2007 | Torres et al. |
| 7,180,087 | B1 | 2/2007 | Loss et al. |
| 7,582,490 | B2 | 9/2009 | Golovchenko et al. |
| 8,294,137 | B2 | 10/2012 | Jain et al. |
| 8,598,006 | B2 | 12/2013 | de Souza et al. |
| 8,680,577 | B2 | 3/2014 | Zhang et al. |
| 8,859,350 | B2 | 10/2014 | Zhang et al. |
| 8,981,344 | B2 | 3/2015 | Jain et al. |
| 2001/0032999 | A1 | 10/2001 | Yoshida |
| 2002/0043895 | A1 | 4/2002 | Richards et al. |
| 2002/0123183 | A1 | 9/2002 | Fitzgerald |
| 2002/0134996 | A1 | 9/2002 | Morie et al. |
| 2002/0196827 | A1 | 12/2002 | Shields et al. |
| 2003/0122179 | A1 | 7/2003 | Matsuki et al. |
| 2003/0127608 | A1 | 7/2003 | Shields et al. |
| 2004/0155253 | A1 | 8/2004 | Chae et al. |
| 2005/0074340 | A1 | 4/2005 | Xu et al. |
| 2005/0153530 | A1 | 7/2005 | Ku et al. |
| 2005/0263795 | A1 | 12/2005 | Choi et al. |
| 2006/0011990 | A1 | 1/2006 | Furukawa et al. |
| 2006/0081930 | A1 | 4/2006 | Maegawa et al. |
| 2006/0163670 | A1 | 7/2006 | Ellis-Monaghan et al. |
| 2007/0007571 | A1 | 1/2007 | Lindsay et al. |
| 2007/0166972 | A1 | 7/2007 | Park |
| 2007/0176227 | A1* | 8/2007 | Liu .................. B82Y 10/00 257/324 |
| 2007/0187776 | A1 | 8/2007 | Sasaki |
| 2007/0189702 | A1 | 8/2007 | Arndt et al. |
| 2007/0210299 | A1 | 9/2007 | Hirose et al. |
| 2007/0215860 | A1 | 9/2007 | Komiyama et al. |
| 2007/0252131 | A1 | 11/2007 | Tong et al. |
| 2007/0298558 | A1 | 12/2007 | Yamauchi et al. |
| 2008/0035962 | A1 | 2/2008 | Kim et al. |
| 2008/0054351 | A1 | 3/2008 | Ooki |
| 2008/0076216 | A1 | 3/2008 | Pae et al. |
| 2008/0079074 | A1* | 4/2008 | Icel .................. H01L 21/823437 257/347 |
| 2008/0122005 | A1* | 5/2008 | Horsky .............. H01L 21/2658 257/369 |
| 2008/0124920 | A1 | 5/2008 | Fitz et al. |
| 2008/0142838 | A1 | 6/2008 | Ohta et al. |
| 2008/0169753 | A1 | 7/2008 | Skipor et al. |
| 2008/0309234 | A1 | 12/2008 | Cho et al. |
| 2009/0054752 | A1 | 2/2009 | Jonnalagadda et al. |
| 2009/0173934 | A1 | 7/2009 | Jain |
| 2009/0194788 | A1 | 8/2009 | Liu et al. |
| 2009/0309229 | A1 | 12/2009 | Angus et al. |
| 2010/0074293 | A1 | 3/2010 | Lochmann et al. |
| 2010/0108984 | A1 | 5/2010 | Cho et al. |
| 2010/0155703 | A1 | 6/2010 | Jun et al. |
| 2010/0163843 | A1 | 7/2010 | Choi et al. |
| 2010/0213553 | A1 | 8/2010 | Hargrove et al. |
| 2010/0224861 | A1 | 9/2010 | Jain et al. |
| 2010/0224938 | A1 | 9/2010 | Zhu |
| 2010/0308374 | A1* | 12/2010 | Liu .................. H01L 21/26506 257/192 |
| 2011/0079767 | A1 | 4/2011 | Senes et al. |
| 2011/0163327 | A1 | 7/2011 | Ueno et al. |
| 2011/0176564 | A1 | 7/2011 | Hogg et al. |
| 2011/0193145 | A1 | 8/2011 | Ikarashi et al. |
| 2011/0309330 | A1 | 12/2011 | Ohnesorge |
| 2012/0080793 | A1 | 4/2012 | Danek et al. |
| 2012/0091448 | A1* | 4/2012 | Ueno .................. H01L 51/506 257/40 |
| 2012/0132966 | A1 | 5/2012 | Doris et al. |
| 2012/0181503 | A1 | 7/2012 | Lee et al. |
| 2012/0229167 | A1 | 9/2012 | Jain et al. |
| 2012/0280208 | A1 | 11/2012 | Jain |
| 2012/0285532 | A1 | 11/2012 | Yun et al. |
| 2012/0313144 | A1 | 12/2012 | Zhang et al. |
| 2013/0093289 | A1 | 4/2013 | Zhang |
| 2013/0302974 | A1* | 11/2013 | Hahn .............. H01L 21/823842 438/585 |
| 2014/0015038 | A1 | 1/2014 | Ng et al. |
| 2014/0084245 | A1 | 3/2014 | Zhang |
| 2014/0084247 | A1 | 3/2014 | Zhang |
| 2015/0053930 | A1 | 2/2015 | Zhang |
| 2016/0111521 | A1 | 4/2016 | Zhang |

OTHER PUBLICATIONS

Zhang, Hongguang et al. "Theoretical Study of the Molecular and Electronic Structures of Neutral Silver Bromide Clusters (AgBr) n, n=1-9", Journal of Physical Chemistry A, Jun. 10, 2000, vol. 104, pp. 6287-6294.
Foster et al., "Natural Hybrid Orbitals," *J. Am. Chem. Soc.* 102:7211-7218, 1980.
Mulliken, "Electronic Population Analysis on LCAO-MO Molecular Wave Functions," *The Journal of Chemical Physics* 23(10):1833-1840, 1955.
Reed et al., "Intermolecular Interactions from a Natural Bond Orbital, Donor-Acceptor Viewpoint," *Chem. Rev.* 88:899-926, 1988.
Wallmeier et al., "Nature of the Semipolar XO Bond. Comparative Ab Initio Study of $H_3NO$, $H_2NOH$, $H_3PO$, $H_2POH$, $H_2P(O)F$, $H_2SO$, HSOH, HClO, ArO, and Related Molecules," *Journal of the American Chemical Society* 101(11):2804-2814, 1979.
Zhang et al., "A Study of Relationship Between Universality in Fractal Colloids Aggregation and Time-dependent SERS," *Science in China* 37(4):395-401, 1994.
Zhang et al., "Quantum size effect studies of isotopic and electronic properties of silver bromide ionic clusters," 2012, 26 pages.
Zhang et al., "Time dependent UC-absorption spectra and surface enhanced Raman scattering of pyridine in AgCl sol," *Spectrochimica Acta Part A* 51:1903-1908, 1995.
Zhang et al., "Time dependent surface enhances Raman spectroscopy of pyridine in AgBr sol," *Spectrochimica Acta* 47A(7):927-932, 1991.
Alivisatos, "Semiconductor Clusters, Nanocrystals, and Quantum Dots," *Science*, New Series, vol. 271, No. 5251 (Feb. 16, 1996), pp. 933-937.
"Theoretical and Experimental Studies of Silver Bromide Clusters," Doctoral dissertation by Hongguang Zhang, University of Texas at Arlington, 2000, 130 pages.

* cited by examiner

ATOMIC LAYER DEPOSITION OF SELECTED MOLECULAR CLUSTERS

RELATED APPLICATION

This patent application claims benefit under 35 U.S.C. § 119(e) of U.S. Provisional Patent Application No. 61/867,930, filed on Aug. 20, 2013, which is hereby incorporated by reference in its entirety.

BACKGROUND

Technical Field

The present disclosure relates to the fabrication of nanometer-sized integrated circuit FET (field effect transistor) devices and, in particular, to methods of tuning performance of the FETs by incorporating selected molecular clusters.

Description of the Related Art

As technology nodes for transistors scale below 10 nm, maintaining control of various electrical characteristics in bulk semiconductor devices becomes increasingly more challenging. Such electrical characteristics include, for example, transistor threshold voltage and contact resistance. The threshold voltage of a transistor fundamentally governs the transition from an "off" state to an "on" state, and therefore dictates the switching speed and the off-state leakage current of the transistor. By tuning the threshold voltage of a transistor, integrated circuit designers can optimize transistor performance by balancing the need for fast switching speed with the need for low power consumption. For example, circuit designers may choose to place low threshold voltage (LVT) transistors, which are fast but leaky, specifically in critical circuit paths that have maximum delays. Slower, high threshold voltage transistors that have low leakage current in the off state can then be used in non-critical paths so that power consumption stays low. Thus, it is advantageous to be able to provide transistors on the same integrated circuit chip that have a range of threshold voltages. Contact resistance at the interface between the source and drain terminals of the transistor and the interconnect structure is another important factor for transistor performance. Keeping the contact resistance low increases signal transmission speeds while reducing power dissipation.

The threshold voltage and the contact resistance of integrated transistor devices are related to atomic, molecular, and crystalline properties of solid state materials used to form the source, drain, and channel regions. Thus, tuning the transistor performance generally involves adjusting material properties of the source and drain regions and of the channel region. Conventional methods of forming source and drain regions have focused on implanting dopant ions in the substrate and annealing the implantation damage to re-crystallize the doped regions. Doping profiles of the source and drain regions can be crafted in this way to influence the transistor threshold voltage. Gate oxide thickness and material properties have also been optimized to improve control of the threshold voltage. More recently, methods have been developed to increase charge carrier mobility within the channel region by imparting tensile or compressive stress to the channel. One way to stress the channel is to alter the gate stack. Another way of introducing stress in the channel is to form epitaxially grown raised source and drain regions, or epitaxially grown layers within the channel. As semiconductor technology nodes continue scaling down to smaller device dimensions, satisfying the requirement to achieve different threshold voltages ($V_t$) for different devices becomes extremely challenging, especially at gate lengths below 10 nm.

Transistor performance parameters such as threshold voltage and contact resistance fundamentally depend on the shape of the energy band structures at material interfaces between p-type and n-type materials within the device. Such interfaces are formed at the junction of the source region and the channel, at the junction of the drain region and the channel, and at metal contacts to the source and drain regions. Each semiconducting material on either side of an interface has a characteristic energy gap that represents the energy input needed to free electrons from the atoms, thus making available charge to conduct a current. An electric potential difference at the interface is overcome by applying a bias voltage that is equal to or greater than the threshold voltage.

The energy band structure of a thin film material is influenced by deposition methods and ambient conditions present during formation of the film. Techniques such as epitaxial growth and atomic layer deposition (ALD) attempt to control film deposition at molecular and atomic levels. Density function theory (DFT) studies familiar to the present inventor predict that the energy gap of a device that includes a molecular cluster thin film in which the cluster size is less than 1 nm will be determined by atomic orbital interactions within the molecules. Such effects of molecular clusters are described in the following journal papers by the present inventor, each of which is hereby incorporated by reference in its entirety: "Theoretical and Experimental Studies of Silver Bromide Clusters," Doctoral dissertation by Hongguang Zhang, University of Texas at Arlington, 2000, hereinafter, "Zhang"; "Theoretical Study of the Molecular and Electronic Structures of Neutral Silver Bromide Clusters (AgBr) n, n=1-9," H. Zhang, Z. A. Schelly, and D. S. Marynick, *Journal of Physical Chemistry A*, Jun. 10, 2000, vol. 104, pp. 6287-6294, hereinafter, "Zhang, et al."; and "Preparation of AgBr Quantum Dots via Electroporation of Vesicles," N. M. Correa, John H. Zhang, and Z. A. Schelly, *Journal of the American Chemical Society*, Jun. 23, 2000, vol. 122, pp. 6432-6434, hereinafter "Correa et al." Also incorporated by reference in their entireties are the following related U.S. Patent documents to the present inventor: U.S. patent application Ser. No. 13/931,096, entitled, "Quantum Dot Array Devices with Metal Source and Drain," filed Jun. 28, 2013; U.S. patent application Ser. No. 13/931,234, entitled "Threshold Adjustment for Quantum Dot Array Devices with Metal Source and Drain," filed Jun. 28, 2013; and U.S. Patent Application Publication No. US2013/0093289, entitled "Size-controllable Opening and Method of Making Same," filed Apr. 18, 2013.

BRIEF SUMMARY

Energy bands of a thin film containing molecular clusters are tuned by controlling the size and the charge of the clusters during thin film deposition. Using atomic layer deposition (ALD), an ionic cluster film is formed in the gate region of a nanometer-scale transistor to adjust the threshold voltage ($V_t$), and a neutral cluster film is formed in the source and drain regions to adjust contact resistance. A work function semiconductor material such as a silver bromide (AgBr) or a lanthanum oxide ($LaO_x$) is deposited so as to include clusters of different sizes such as dimers, trimers, and tetramers, formed from isolated monomers. Different molecular clusters have different associated energy band gaps depending on the atomic orbital interactions of the constituent atoms.

A type of Atomic Layer Deposition (ALD) system is disclosed, along with a method for depositing on semiconductor wafers certain molecular clusters to form thin film junctions having selected energy gaps. In one embodiment, an ion source produces a beam of ions containing different ionic clusters which are then selected for deposition by passing the beam through a charge filter and a size filter. The charge filter employs a magnetic field. The size filter has different apertures to select for cluster size and orientation. Methods of enhancing the production of high spin clusters are also disclosed, as are methods of controlling the sizes of clusters produced at the source. A desired cluster film thickness and uniformity can be achieved by varying the speed of a wafer transport mechanism supporting the target wafer.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure. Accordingly, the present disclosure is not limited except as by the appended claims.

In this description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Reference throughout the specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Figure 1A:
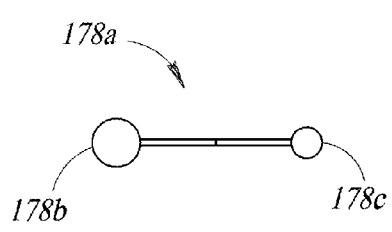
FIG. 1A is a molecular diagram of a monomer having a silver atom and a bromine atom.
Figure 1B:
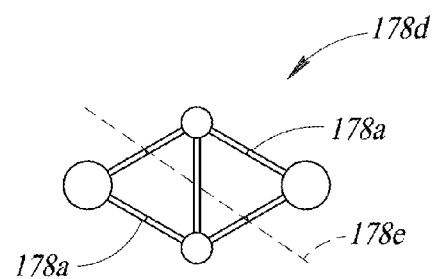
FIG. 1B is a molecular diagram of a dimer made by combining two monomers as shown in FIG. 1A.
Figure 1C:
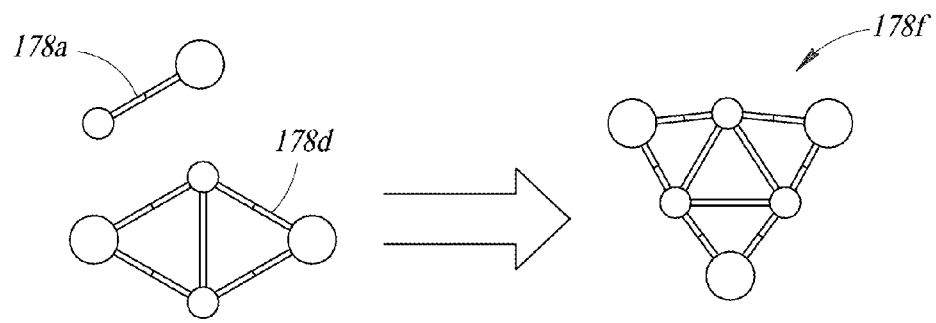
FIG. 1C is a pair of molecular diagrams illustrating building a trimer from the monomer shown in FIG. 1A and the dimer shown in FIG. 1B.
Figure 1D:
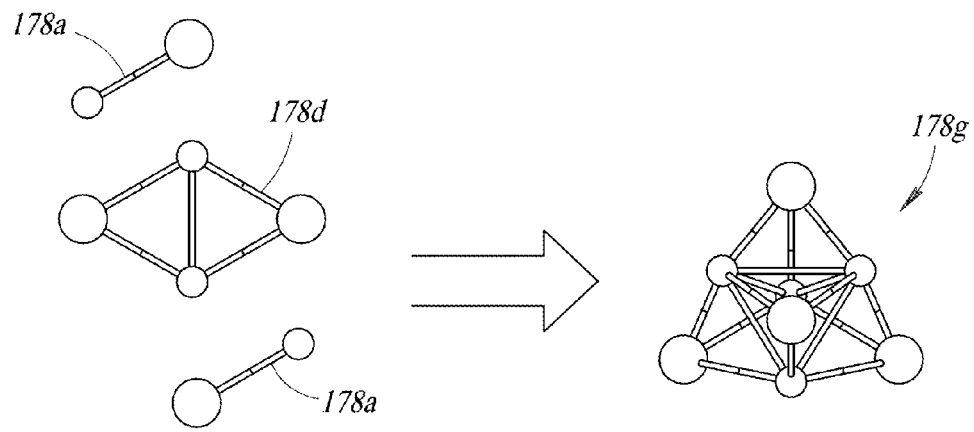
FIG. 1D is a pair of molecular diagrams illustrating building a tetramer from two monomers as shown in FIG. 1A and the dimer shown in FIG. 1B.

FIGS. 1A-1D illustrate formation of molecular clusters during thin film deposition. Clusters may be neutral molecular clusters, or they may be ionic molecular clusters having a net charge, or a net charge distribution. Formation of molecular clusters from isolated monomers has been studied previously by the present inventor, as previously cited herein. Clusters are formed by attachment of isolated monomers to molecules, or by accumulation of monomers into a molecular cluster as illustrated in FIGS. 1A-1D. A monomer is a basic molecular unit, for example, two bound atoms, or three atoms joined in a triangular unit. FIG. 1A shows an example of a two-atom AgBr monomer 178a having a large bromine atom 178b and a small silver atom 178c. Two such monomers 178a can bind together to form a dimer 178d having four atoms, as shown in FIG. 1B. The dimer 178d contains three chemical bonds along an axis 178e. Subsequently, another isolated monomer 178a can attach to the dimer 178d to form a trimer 178f that includes six atoms, three Ag and three Br, as shown in FIG. 1C. Two isolated monomers 178a can attach to the dimer 178d to form a tetramer 178g having eight atoms, as shown in FIG. 1D, and so on. All of the clusters shown in FIGS. 1A-1D are neutral molecular clusters, because for every Ag atom the cluster also includes a corresponding Br atom. When the number of Ag and Br atoms is not equal, the cluster is an ionic cluster.

Figure 2:
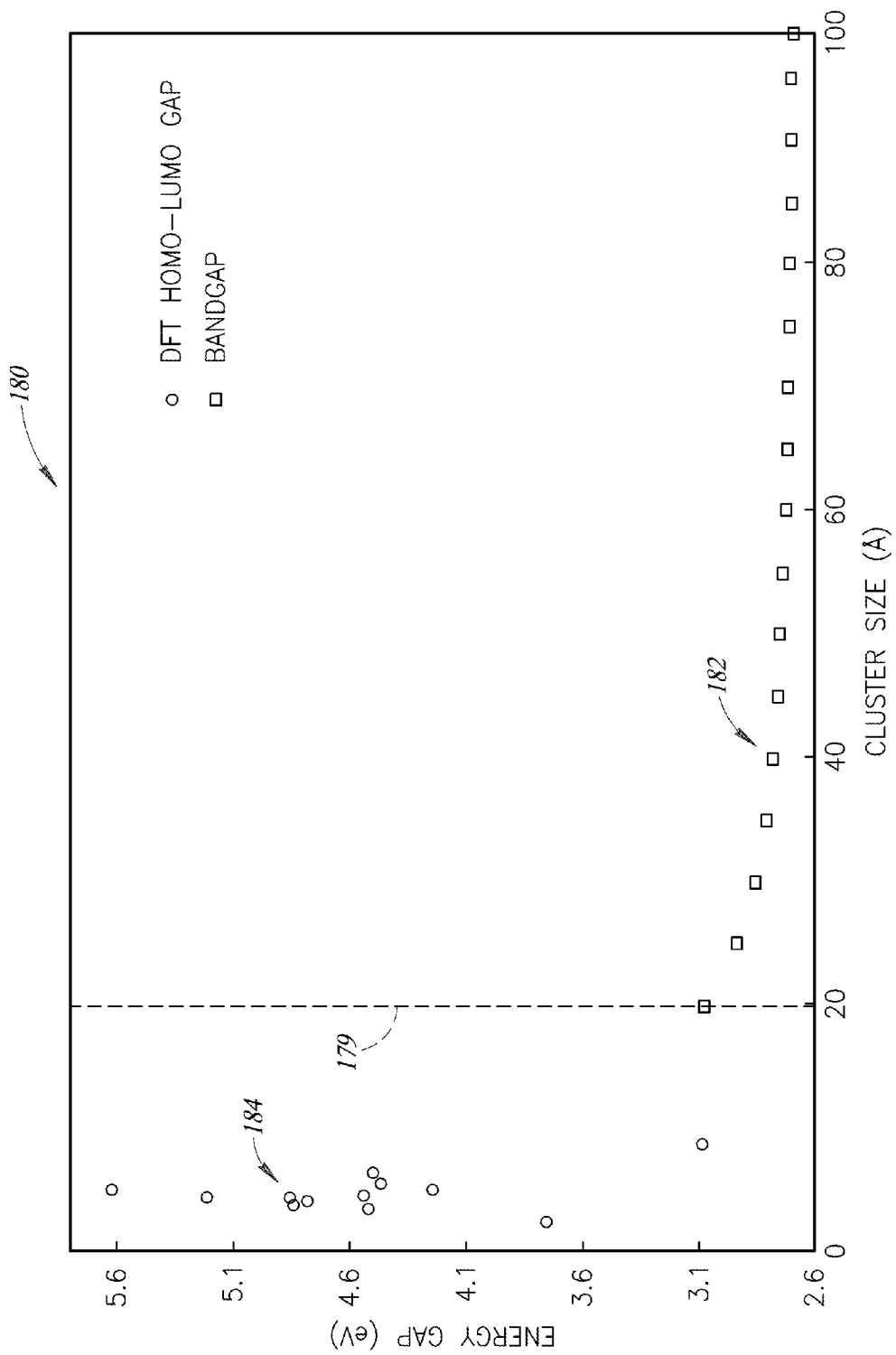
FIG. 2 is a theoretical plot of a predicted relationship between energy and cluster size for molecular clusters up to 100 Å.

FIG. 2 shows a graph 180 of energy band gaps as a function of cluster size for various AgBr molecular clusters. The predicted relationships shown between energy gaps and cluster size are computed from ultraviolet absorption spectra of AgBr clusters, as described in the Zhang et al. reference. Consequently, when an AgBr metallic film is deposited onto a silicon substrate, the energy band gap at the silicon-metal interface is altered depending on the AgBr cluster size. For cluster sizes in the range of about 20-100 Å, the associated energy band gap 182 of the AgBr film decreases monotonically from about 3.1 to 2.7 eV. However, there exists a transition 179 below which AgBr clusters are associated with much larger and wider ranging energy band gaps 184. The transition 179 occurs at about 20 Å. At molecular cluster sizes below 20 Å, the energy band gap 184 is the difference between the HOMO (highest occupied molecular orbital) and LUMO (lowest unoccupied molecular orbital) energies, known as the HOMO-LUMO gap. The HOMO-LUMO gap is qualitatively similar to the semiconductor energy band gap that characterizes crystals at large length scales, e.g., 20-100 Å. In particular, AgBr clusters smaller than about 10 Å have HOMO-LUMO gaps within the range of about 3.5 eV to 5.5 eV, which values are similar to those of the energy band gaps associated with nFET and pFET band edges.

A similar relationship is known to exist for other molecular clusters such as, for example, sulfur oxide. Analogously, $LaO_2$ clusters are expected to exhibit similar behavior. Thus, controlling the cluster formation process during film deposition can achieve a desired energy gap and a corresponding threshold voltage. Although AgBr clusters are used here as an example, other clusters having an associated HOMO-LUMO gap close to the energy gap of silicon can also be used to tune properties of silicon transistors. For example, copper or gold, combined with one of the elements from either group 7 or group 6 of the periodic table, depending on the desired electrical properties. Alternatively, aluminum, gallium, or indium may be combined with group 1 or group 7 elements to form molecular clusters.

Figure 3:
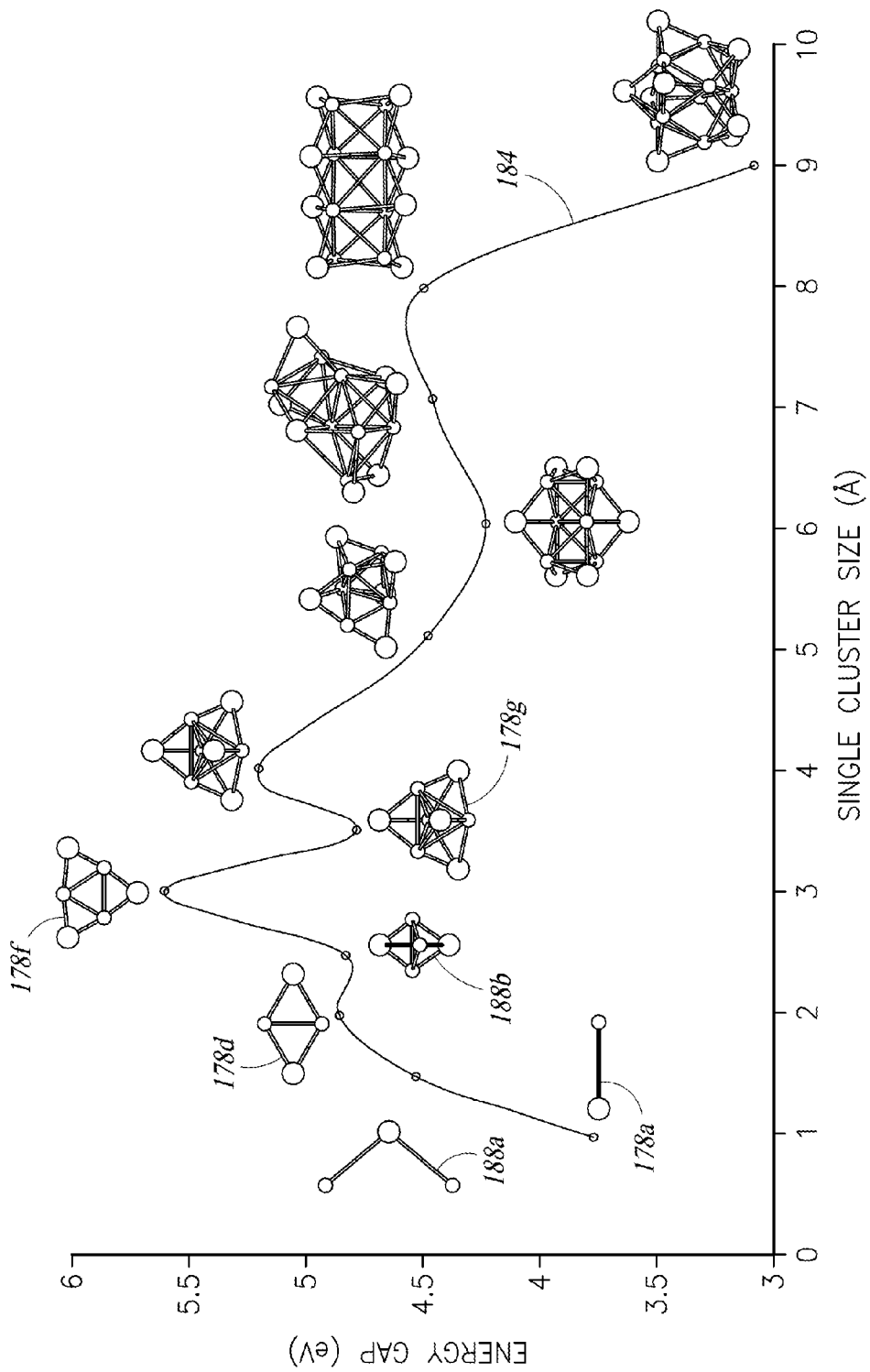
FIG. 3 is an expansion of the plot shown in FIG. 2 for clusters smaller than 10 Å.

FIG. 3 shows an expanded view of the energy band gaps 184 shown in FIG. 2 for cluster sizes below 10 Å, along with molecular model diagrams of the associated clusters. Both ionic clusters and neutral clusters are shown in FIG. 3. For example, the monomer 178a, the dimer 178d, the trimer 178f, and the tetramer 178g, all of which are neutral clusters, are shown next to their associated energy gap values. Ionic clusters 188a having three atoms and 188b having five atoms each include more silver atoms than bromine atoms, and thus carry a net charge. The desired cluster can be selected from the graph shown in FIG. 3. For example, if a thin film having an energy gap of about 4.5 eV is desired, ionic clusters 188a can be incorporated into the film.

Figure 4:
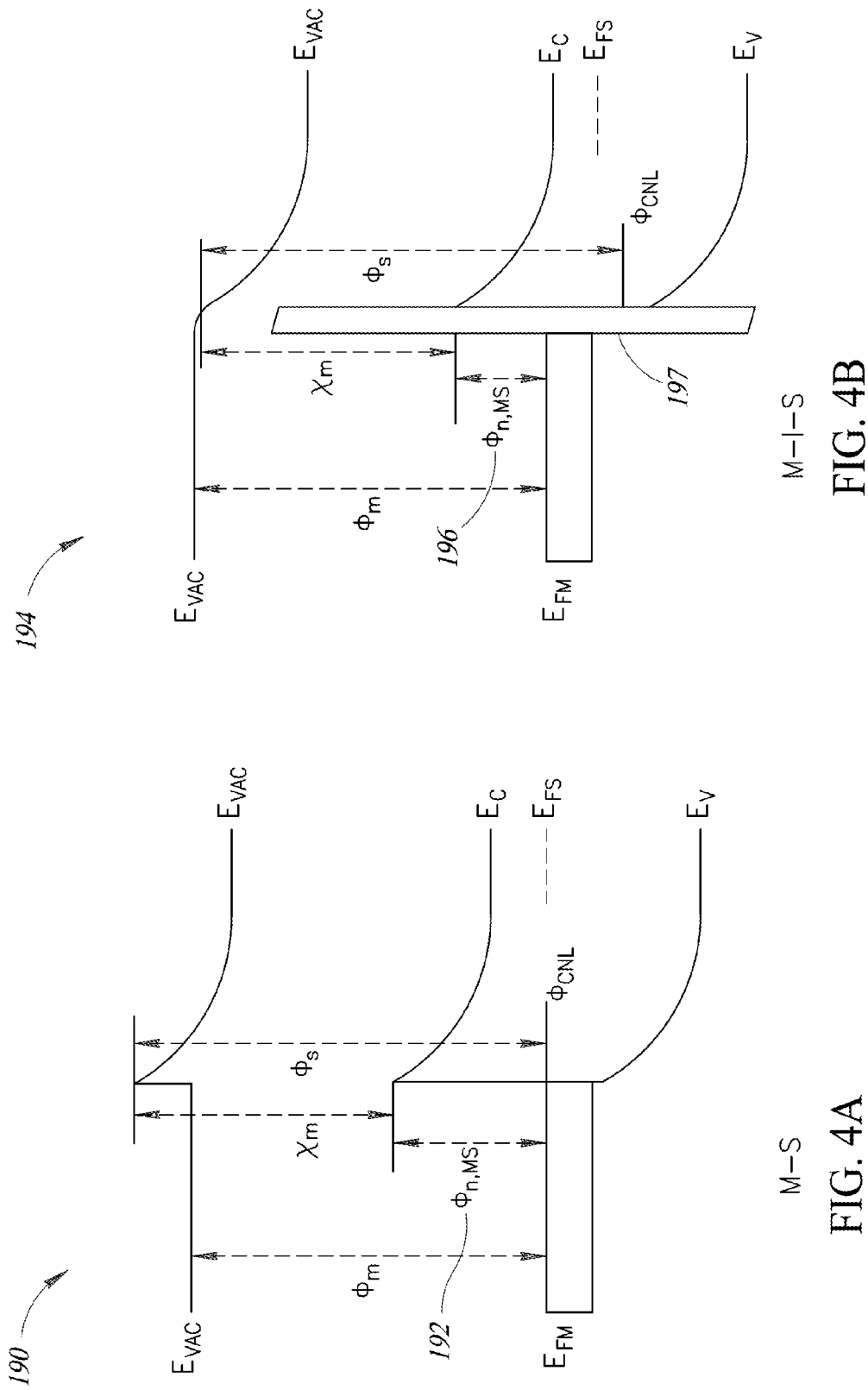
FIG. 4A is an energy band diagram illustrating the interface of a metal-semiconductor contact.
FIG. 4B is an energy band diagram illustrating the interface of a metal-insulator-semiconductor contact.

FIG. 4A shows a typical M-S energy band diagram 190 characterizing a metal-semiconductor interface having a band gap, $\Phi_{n,\,MS}$ 192. Such an interface exists at, for example, electrical contacts to the source and drain regions where a metal material such as copper contacts an n-type or p-type silicon material. FIG. 4B shows an M-I-S energy band diagram 194 characterizing a metal-insulator-semiconductor interface having a band gap, $\Phi_{n,\,MIS}$ 196. Insertion of an insulator 197 in the form of a neutral cluster film between the metal and semiconductor layers shifts the band structure of the contact, thus lowering the barrier for conduction by about 30% compared with the band gap 192 corresponding to the M-S device. Commensurately, the contact resistance at the interface of the M-I-S device is 30% lower than that of the M-S device.

Similarly, ionic cluster films can be incorporated into the gate stack to alter the threshold voltage of the transistor by adjusting the energy gap at the interface between the metal gate and the gate dielectric. For example, a gate dielectric made of hafnium oxide ($HfO_2$) formed adjacent to a metal gate having a work function of 4.9 eV can be altered by incorporating an atomic oxide into the gate dielectric. For example, by incorporating tantalum oxide ($TaO_2$), the effective work function of the gate is lowered from 4.9 eV to 4.3 eV, thus lowering the threshold voltage by 0.6 V. In a conventional device, a desired work function may be obtained by stacking multiple metal layers onto the gate. However, a multi-layer gate stack requires a metal patterning step for each component film in the gate stack. Whereas, altering the energy gap at the metal-dielectric interface by incorporating ionic clusters does not entail the use of additional mask patterning steps.

Figure 5:
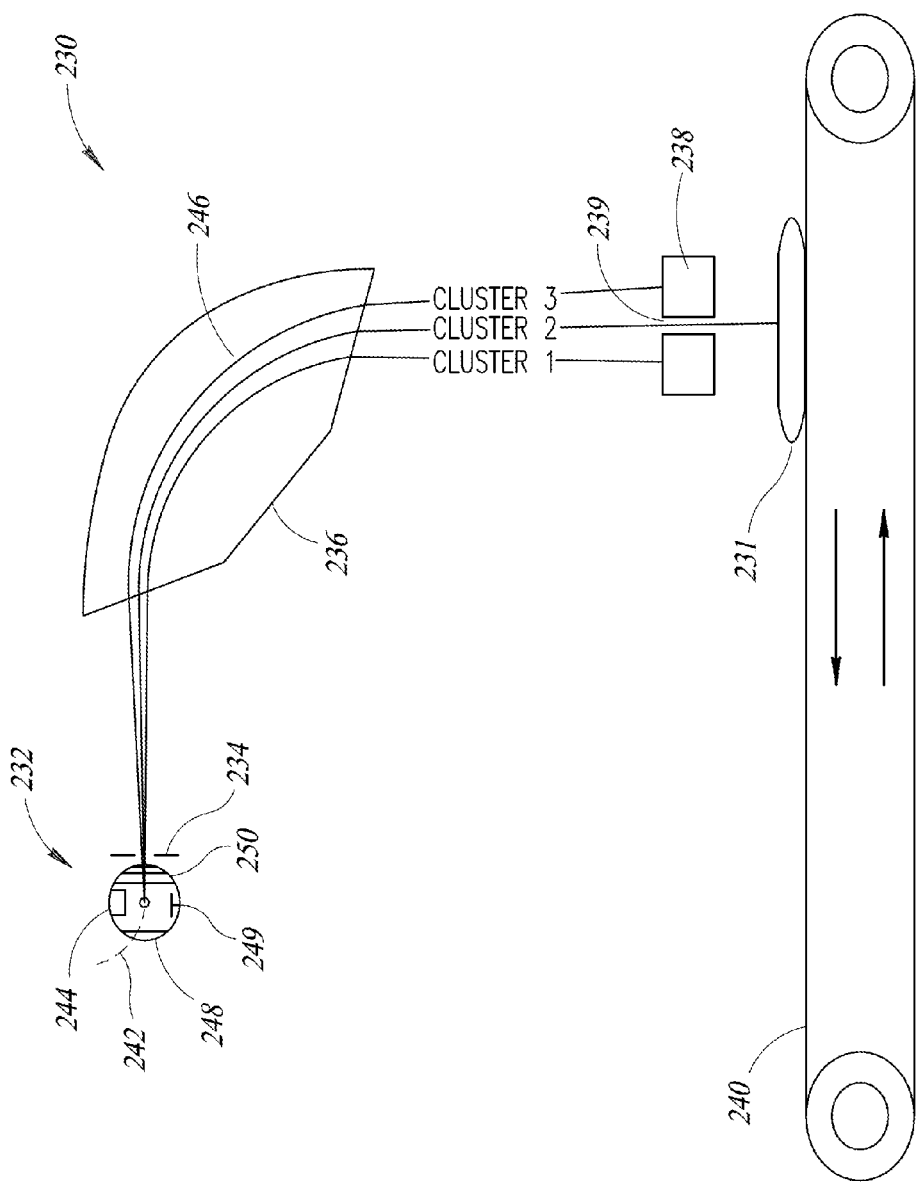
FIG. 5 is a schematic diagram of a system for generating ionic clusters and depositing selected ionic clusters on a semiconductor wafer, based on the electric charge and size/mass of the cluster, according to an embodiment described herein.

FIG. 5 shows an exemplary molecular cluster film deposition system 230 for selectively depositing ionic cluster or neutral cluster films onto a target wafer 231, according to one exemplary embodiment. In one embodiment, the molecular cluster film deposition system 230 is a modified atomic layer deposition (ALD) system. The molecular cluster film deposition system 230 includes a precursor source 232, a beam-focusing element 234, a magnet 236, a filter 238 having an aperture 239, and a wafer transport device 240. The cluster film deposition system 230 as shown is implemented within a vacuum chamber. The precursor source 232 produces ions, e.g., $Ag^+Br$, or ionic clusters, e.g., $(AgBr)^+$, from a gas inflow 242 using, for example, an ionizing filament 244. The ionizing filament 244 applies an electric current to ionize the gas. Ions thus produced can be formed into an ion beam 246 by an ion repeller 248, an electron trap 249, an ion accelerator 250, and the beam focusing element 234. The ion repeller 248 prevents ions from accumulating inside the precursor source 232. The electron trap 249 extracts free electrons from the ion source so as not to neutralize the ions. The ion accelerator 250 applies an electric field to extract ions from the precursor source 232 and guide the ions toward the beam focusing element 234, which focuses the trajectories of the ions into the ion beam 246. The ion beam 246 is then directed toward the magnet 236, which deflects the overall ion beam path through an angle, shown as 90 degrees. Different ionic clusters within the ion beam 246 are deflected through slightly different angles depending on their charge-to-mass ratio, similar to the way in which a mass spectrometer operates. Ionic clusters within the ion beam 246 then advance toward the target wafer 231. When the desired molecular clusters are neutral clusters, ionic clusters in the ion beam 246 may be neutralized by depositing onto a doped film of opposite polarity at the surface of the target wafer 231. Prior to landing on the target wafer 231, the ionic clusters pass through the filter 238. The filter 238 may have a single aperture 239 that allows clusters of a certain size, charge, or orientation to pass therethrough while others are blocked. Alternatively, the filter 238 may include a plurality of small apertures that act as a mask through which ionic clusters pass as they approach the target wafer 231.

Figure 6:
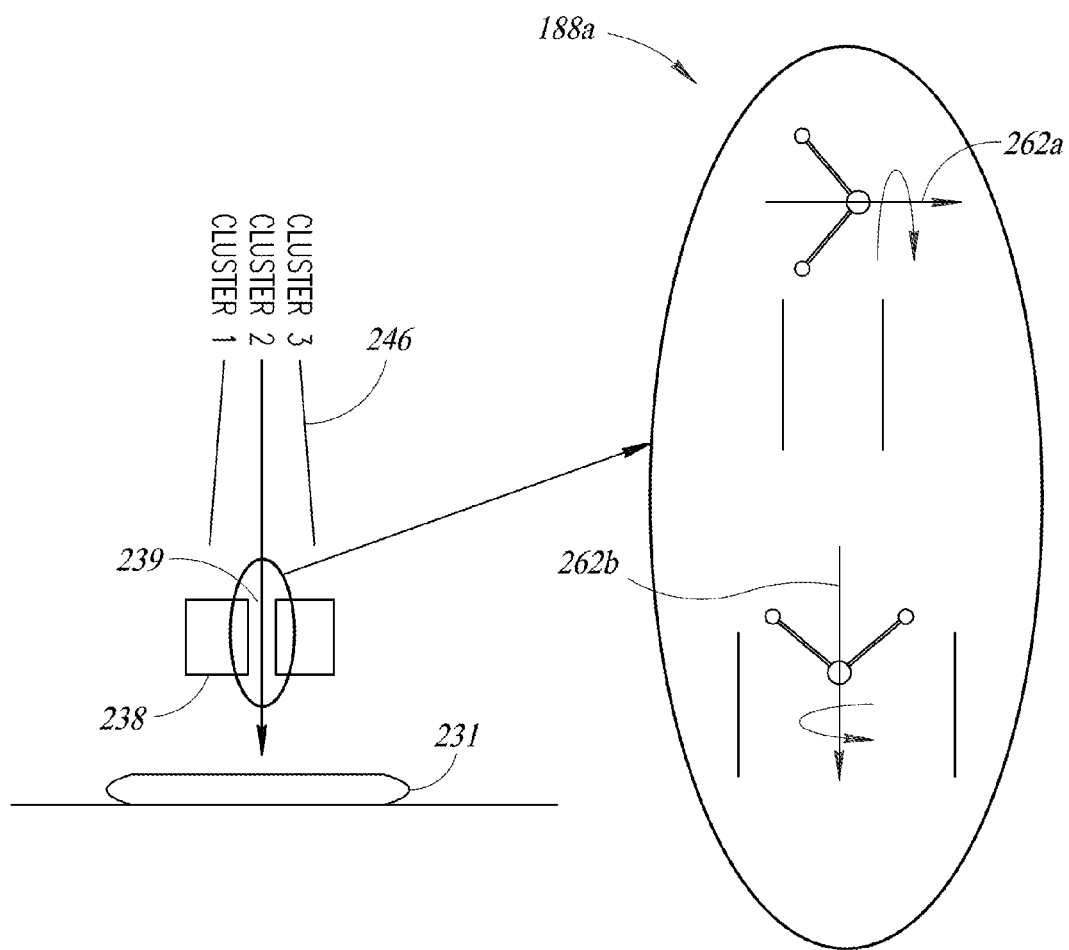
FIG. 6 is a magnified view of an aperture within the system shown in FIG. 5, according to an embodiment described herein.

With reference to FIGS. 5 and 6, there are at least three different techniques that can be implemented in the molecular cluster film deposition system 230 to place the ionic clusters at a desired location on the target wafer 231. According to a first technique, the wafer transport device 240 is programmed to move the target wafer 231 to a desired location with respect to the ion trajectories within the ion beam 246. In this embodiment, the wafer is positioned at the desired location. According to a second alternative embodiment, the filter 238 through which the ionic clusters pass as they are approaching the target wafer 231 may also be moved to a desired location. The filter 238 can be physically shifted to different locations by appropriate stepper motors and mask adjustment mechanisms of the type typically used for adjusting reticles when imaging semiconductor wafers, to place the filter 238 at a desired location in order to direct the desired ionic clusters to the target wafer 231. In such an embodiment, a cluster mask can be positioned over a desired location on the target wafer 231 to which the same ionic clusters are to be delivered. The ion beam 246 containing the ionic clusters is applied to the entire filter, and the ionic clusters pass through the plurality of apertures, according to their size and/or orientation, in order to be delivered at substantially the same time to the target wafer 231 at a plurality of sites. Such a technique therefore permits a plurality of locations on the wafer, such as all the sources, all the drains, or a subset thereof, to selectively receive the ionic clusters in order to achieve the desired electrical properties as described herein.

Figure 7:
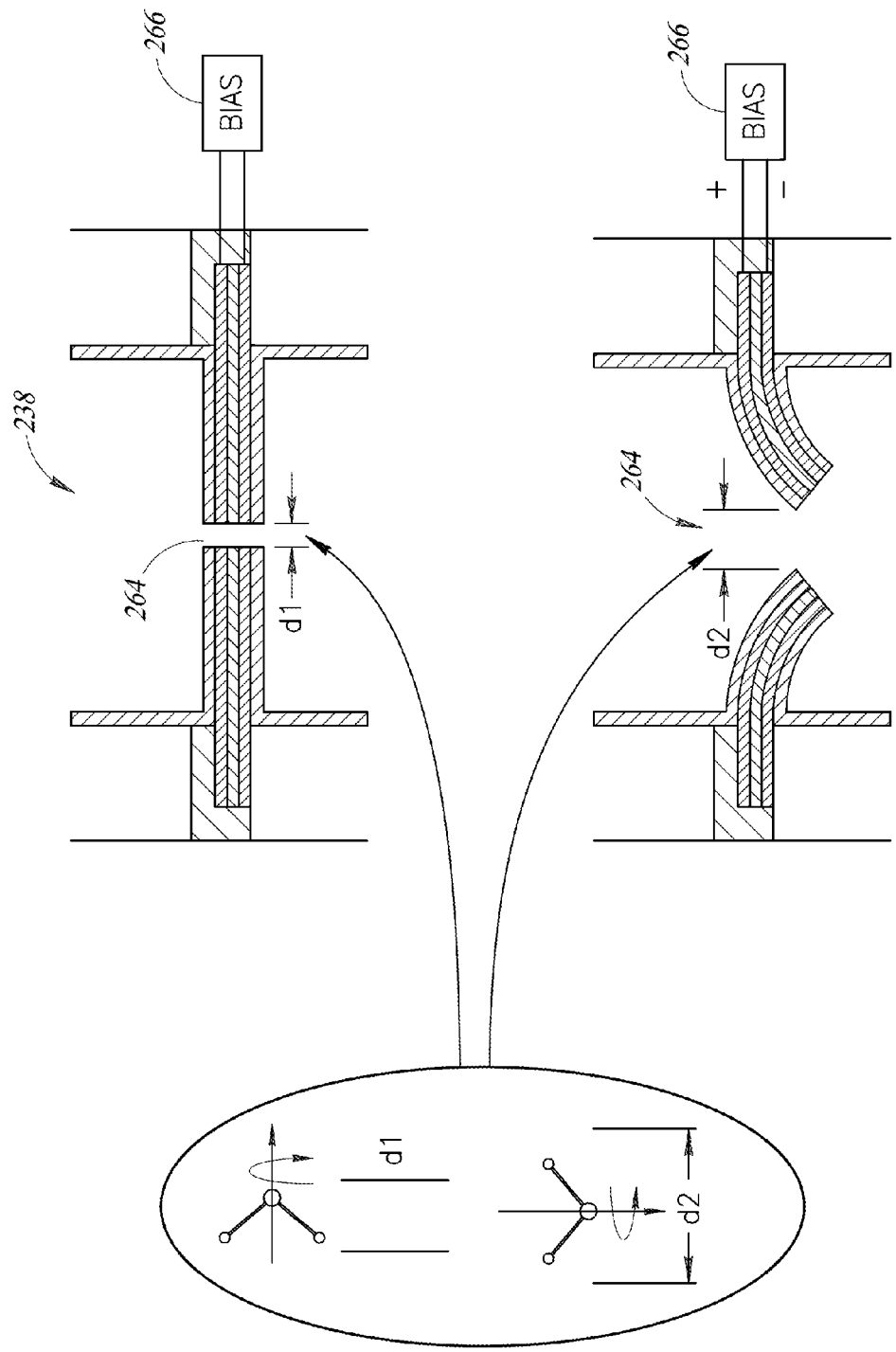
FIG. 7 is a side view of one embodiment of the aperture shown in FIG. 6, as described herein.

FIGS. 6 and 7 show in greater detail a second technique in which the filter 238 selects molecular clusters according to their orientation. For example, the ionic cluster 188a having an axis of symmetry 262b oriented parallel to the beam direction is wider than a similar ionic cluster 188a having an axis of symmetry 262a oriented transverse to the beam direction. Thus, one or more apertures 239 within the filter 238 can be sized narrowly enough to pass the transverse cluster having axis 262a while blocking the parallel cluster having axis 262b. Alternatively, a filter 238 having a size-controllable aperture 264 can be used, such as the one shown in FIG. 7, and described in the '289 publication. In one embodiment, the size-controllable aperture 264 includes one or more piezoelectric membranes that can be adjustably deformed by applying an electric bias voltage 266. Thus, the aperture size can be made to increase from an initial diameter d1 to a larger diameter d2 that will pass the parallel cluster having axis 262b. Filtering molecular clusters based on their orientation can be used for both ionic clusters and neutral clusters.

A third acceptable technique is to use a steering mechanism to steer the ion beam 246 toward a specific location on the target wafer 231. As explained herein and also illustrated in FIG. 5, the magnet 236 can be used to steer the ion beam 246 to a desired path and to reach a desired location. Additionally or alternatively, the target wafer 231 can be electrically charged so as to influence trajectories of ionic clusters as they approach the wafer surface. Beam steering may be used to provide fine-tune adjustment to direct desired ionic clusters to a selected location on the target wafer 231. These are just three of the techniques that are acceptable for ensuring that the ionic clusters, or neutral clusters, are delivered to a desired location on the wafer. Other techniques can also be used.

The thickness and uniformity of the resulting cluster film, as well as the density of the molecular clusters at a particular wafer location, can be selectively achieved according to desired electrical characteristics based on timing, movement, or combinations thereof. For example, the target wafer 231 and/or the filter 238 can be moved slightly during application of the molecular clusters in order to provide a thinner layer—the faster the movement, the thinner the layer, and the more spaced out the ionic clusters are from each other. Similarly, the target wafer 231 and/or the filter 238 can be held stationary in order to build up a large quantity of molecular clusters at particular selected locations. Additionally or alternatively, the surface of the target wafer 231 can be charged negatively to attract Ag ionic clusters or positively to attract Br ionic clusters.

It is noted that deposition systems other than the molecular cluster film deposition system 230 as described above can be used to deposit the molecular cluster films disclosed herein. Alternative delivery systems may employ a jet carrier gas or a spin-on-glass deposition process, for example. The devices and methods presented herein are not dependent upon the deposition system shown, which is one of many sets of equipment that may be used. Furthermore, the filter 239, having one or more apertures 239, or being equipped with the size-controllable aperture 264, can also be a feature of such alternative delivery systems.

Figure 8:
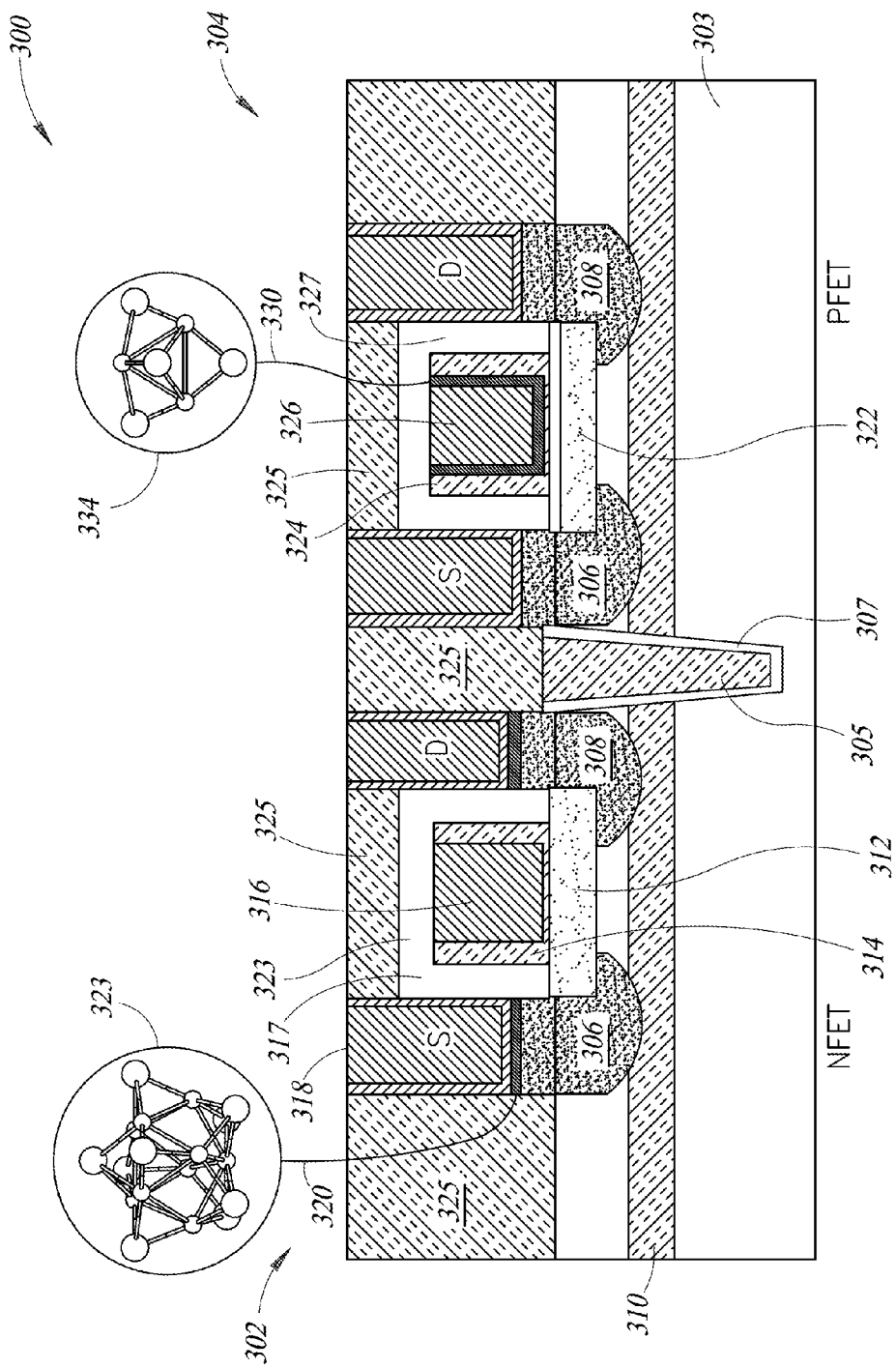
FIG. 8 is a cross-sectional view of an NFET device that includes molecular clusters at the source/drain contact interface.

FIG. 8 shows a cross-sectional view 300 of an NFET transistor 302 and a PFET transistor 304 that include molecular cluster ALD-deposited films, according to a first embodiment. The exemplary transistors 302 and 304 are fully depleted silicon-on-insulator (FD-SOI) type devices formed on a silicon substrate 303. However, the molecular cluster films described herein are suitable for use in other types of CMOS devices as well, such as, for example, ultra-thin body buried oxide (UTBB) transistors, or combination UTBB/FD-SOI devices, known to those skilled in the art of transistor design and fabrication. The exemplary transistors 302 and 304 include epitaxial raised source and drain regions 306 and 308, respectively, which extend downward into the substrate 303 to a buried oxide (BOX) layer 310. An isolation trench 305 filled with an insulator, e.g., $SiO_2$, electrically isolates the NFET transistor 302 from the PFET transistor 304. The isolation trench 305 may include a liner 307 made of, for example, SiN.

The NFET transistor 302 includes a channel region 312, a low-k gate dielectric 314, a multi-layer metal gate 316, a spacer 317, and an insulating layer 325 e.g., an inter-layer dielectric. The channel region 312 may be a high-mobility strained silicon channel in which a germanium layer is formed over the silicon and diffused to produce a SiGe layer having tensile stress. At the metal-semiconductor interface of source and drain contacts 318 with the source and drain regions 306 and 308, respectively, an insulating molecular cluster film 320 may be inserted to form an M-S interface having reduced contact resistance. The molecular cluster film 320 is made of AgBr or $TiO_2$, for example. The molecular cluster 323 as shown is a neutral cluster.

The PFET transistor 304 includes a channel region 322, a low-k gate dielectric 324, a multi-layer metal gate 326, and a spacer 327. The channel region 322 may be a high-mobility strained silicon channel in which a germanium layer is formed under the silicon and diffused to produce a SiGe layer having compressive stress. At the interface of two layers within the multi-layer metal gate 326, there is inserted a work function ionic cluster film 330 that enhances the compressive stress in the channel region, thereby increasing mobility of the charge carriers. The work function ionic cluster film 320 is made of AgBr or $LaO_2$, for example. The molecular cluster 334 as shown is an ionic cluster in which the number of bromine atoms is one greater than the number of silver atoms.

Figure 9A:
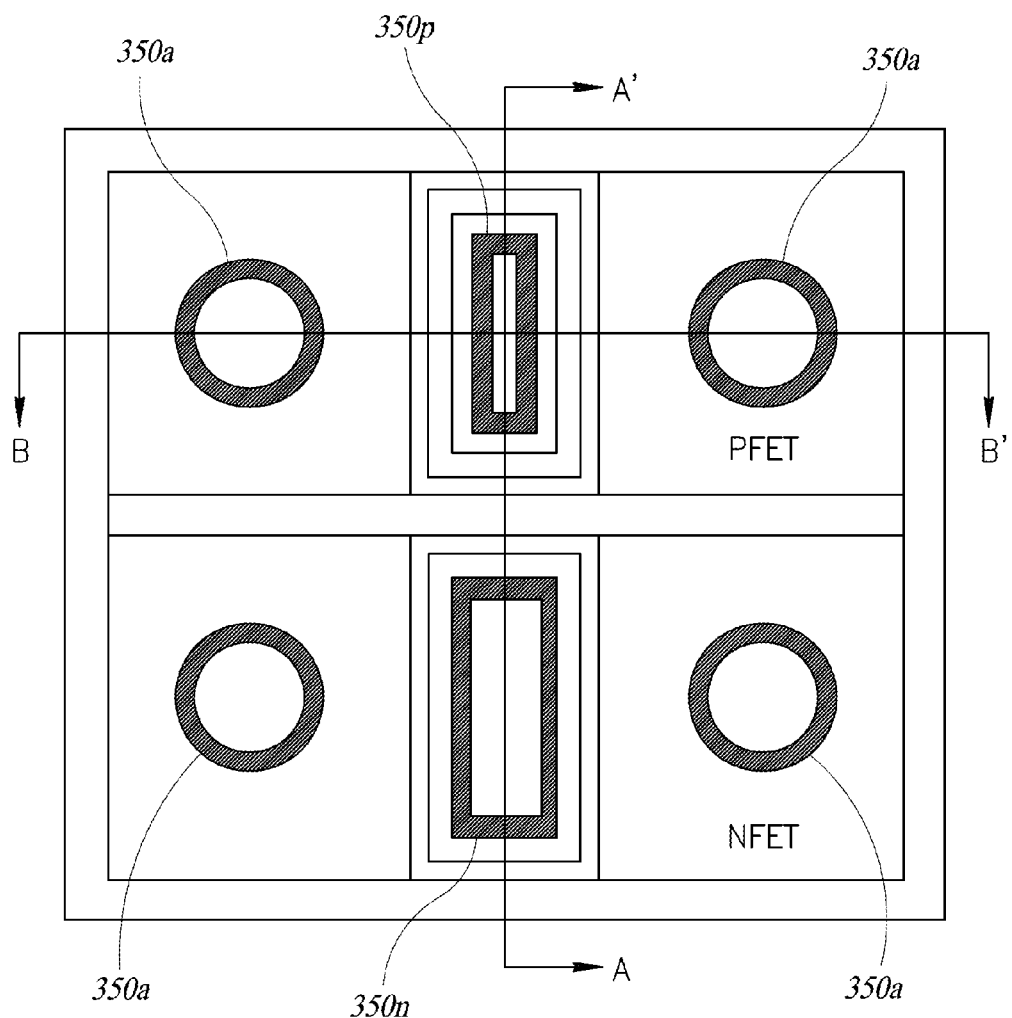
FIG. 9A is a top plan view of NFET and PFET devices that have been fabricated with source/drain quantum dots.
Figure 9B:
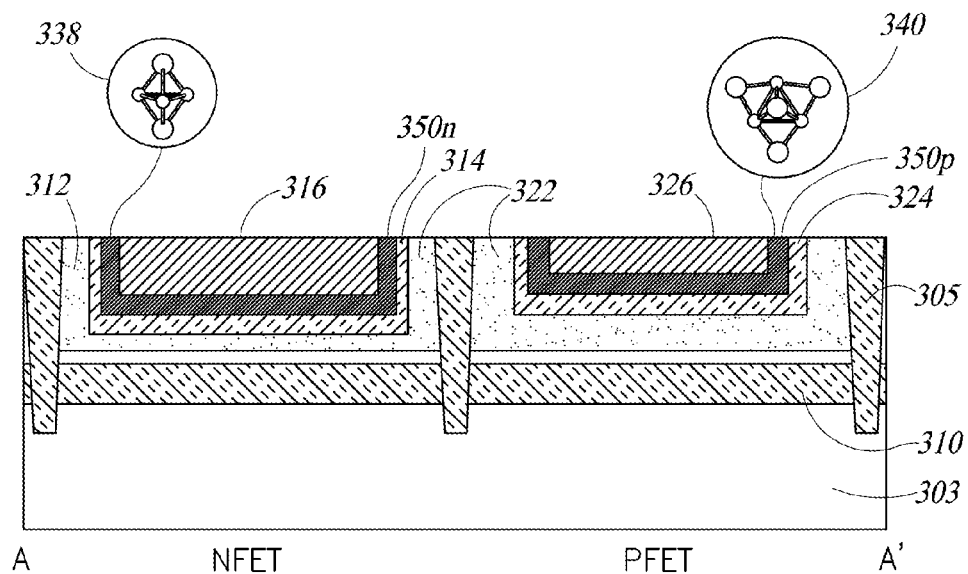
FIG. 9B is a cross-sectional view of the devices shown in FIG. 9A, taken along the cut line A-A'.
Figure 9C:
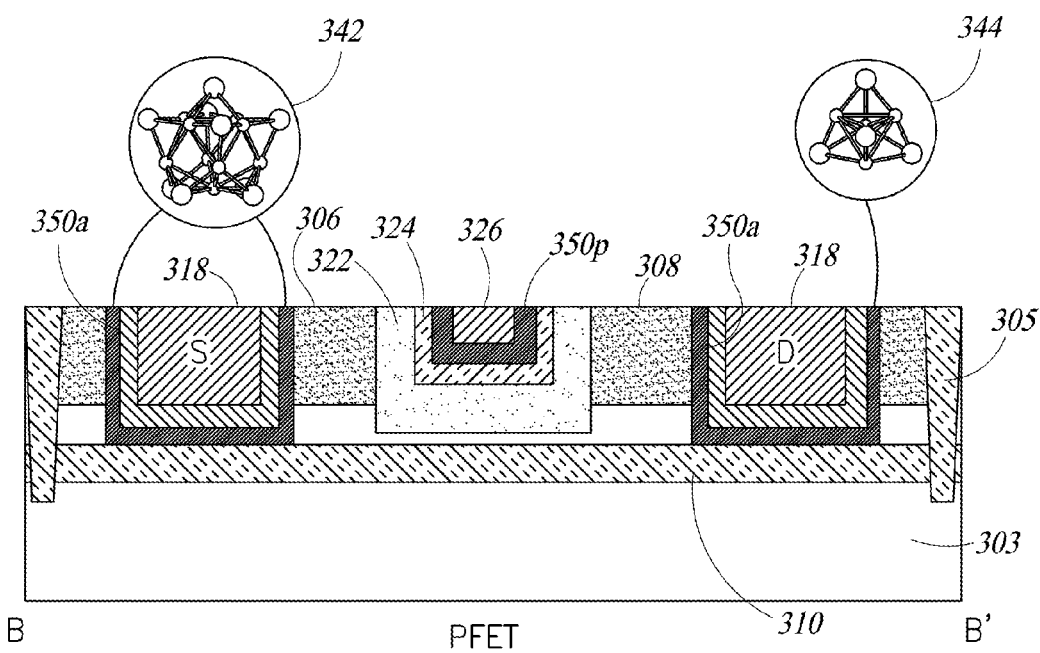
FIG. 9C is a cross-sectional view of the devices shown in FIG. 9A, taken along the cut line B-B'.

FIGS. 9A-9C illustrate NFET and PFET transistors that include molecular cluster ALD-deposited films, according to a second embodiment. In the second embodiment, the transistors include molecular cluster quantum dot films 350a in the source and drain regions and ionic cluster quantum dot films 350n and 350p in the channel regions of the NFET and PFET devices, respectively. A quantum dot is a general term referring to a semiconductor nanocrystal, in the range of about 10-100 atoms in diameter, that exhibits quantum mechanical properties [Wikipedia article, "*Quantum Dot*," August 2014]. Such quantum mechanical properties include the interfacial atomic band gap behavior described above.

FIG. 9A shows a top plan view of the two transistors, in which the PFET device is represented in the upper panel and the NFET device is represented in the lower panel. FIG. 9B shows a corresponding cross-sectional view cut through the channel regions of both devices along a cut line A-A'. Corresponding parts of the exemplary transistors shown in FIGS. 9B and 9C are labeled with common reference numbers as in FIG. 8, e.g., substrate 303, buried oxide 310, isolation trench 305, metal gates 316, 326, and so on. The transistors shown in FIGS. 9A-9C differ structurally from the device shown in FIG. 8, at least in that they have recessed gates, similar to devices known in the art and described in U.S. Patent Publication No. 2007/0007571. The channel regions of the NFET and PFET devices each include a quantum dot channel film 350b containing molecular clusters 338 and 340, respectively. In one embodiment, the molecular cluster 338 is a 5-atom ionic cluster made of, for example, $Ag_2Br$ or $La_2O$, and the molecular cluster 340 is a 7-atom ionic cluster made of $AgBr_2$ or $LaO_2$. The ionic clusters 338 and 340 are designed for $V_t$ adjustment and high current flow in the "on" state for the respective p-channel and n-channel devices.

FIG. 9C shows a corresponding cross-sectional slice through the PFET device. In addition to the recessed gates, recessed source and drain contacts 318 are shown as embedded in the source and drain regions. The source and drain contacts 318 are in the form of metal quantum dots that are insulated by a layer of neutral molecular clusters 342 and 344 formed on the sidewalls and the bottom of the source and drain contacts 318, at the interface with the source and drain regions 306 and 308.

The two embodiments shown in FIGS. 8 and 9A-9C provide examples of devices that can accommodate and benefit from the use of molecular cluster thin films. However, molecular clusters can be incorporated into devices having many different geometries, and therefore the embodiments shown are only exemplary and are not meant to be considered as comprehensive.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transistor formed on a substrate, the transistor comprising:
   a source region;
   a drain region;
   a channel region extending between the source region and the drain region;
   a metal gate region including a metal gate that includes a conductive metal portion;
   contacts that couple the source region, the drain region, and the metal gate to a multi-layer metal interconnect structure; and
   a molecular cluster thin film contacting the conductive metal portion of the metal gate, the molecular cluster thin film comprising nanoscale molecular clusters including at least two bonded atoms that are different, the nanoscale molecular clusters having a selected atomic structure that determines an electrical characteristic of the transistor, the molecular cluster thin film being between the conductive metal portion of the metal gate and the channel region.

2. The transistor of claim 1 wherein the molecular cluster thin film includes one or more of monomers, dimers, trimers, and tetramers.

3. The transistor of claim 1 wherein the molecular cluster thin film is a work function metal film within the metal gate region, and the electrical characteristic is a threshold voltage at which the transistor is activated.

4. The transistor of claim 1 wherein the contacts comprise metal-insulator-semiconductor contacts to the source region and the drain region, the metal-insulator-semiconductor contacts including the molecular cluster thin film, and wherein the electrical characteristic is contact resistance.

5. The transistor of claim 1 wherein the molecular cluster thin film includes one or more of silver bromide ($Ag_xBr_y$), lanthanum oxide ($La_xO_y$) and titanium oxide ($Ti_xO_y$).

6. The transistor of claim 1 wherein the nanoscale molecular clusters have a size of less than 0.5 nm.

7. The transistor of claim 1 wherein the metal gate and the contacts are recessed below a surface of the substrate.

8. The transistor of claim 1 wherein the molecular cluster thin film is an ionic molecular thin film, and wherein the nanoscale molecular clusters are ionic nanoscale molecular clusters.

9. The transistor of claim 8, further comprising a neutral molecular cluster thin film in the source region and the drain region, wherein the neutral molecular thin film comprises neutral nanoscale molecular clusters.

10. The transistor of claim 9 wherein the neutral nanoscale molecular clusters have a selected spatial orientation.

11. The transistor of claim 8 wherein the ionic nanoscale molecular clusters are positively charged.

12. The transistor of claim 8 wherein the ionic nanoscale molecular clusters have a selected spatial orientation.

13. An n-type semiconductor device, comprising:
   a silicon substrate having an oxide layer buried therein;
   a negatively-doped source region;
   a negatively-doped drain region;
   a channel through which current flows between the negatively-doped source region and the negatively-doped drain region;
   a neutral molecular cluster thin film in the negatively-doped source region and the negatively-doped drain region, the neutral molecular cluster thin film comprising neutral molecular clusters;
   a metal gate region comprising a metal gate capacitively coupled to the channel so as to control the current, the metal gate including a conductive metal portion;
   an ionic molecular cluster thin film contacting the conductive metal portion of the metal gate, the ionic molecular cluster thin film comprising ionic molecular clusters, the molecular cluster thin film being between the conductive metal portion of the metal gate and the channel; and
   metal-insulator-semiconductor contacts to the source region and the drain region.

14. The n-type semiconductor device of claim 13 wherein the neutral molecular clusters have a selected spatial orientation.

15. The n-type semiconductor device of claim 13 wherein the ionic molecular clusters impart a tensile stress at a silicon/germanium interface in the channel.

16. A p-type semiconductor device, comprising:
   a silicon substrate having an oxide layer buried therein;
   a positively-doped source region;
   a positively-doped drain region;
   a channel through which current flows between the positively-doped source region and the positively-doped drain region, the channel having a strained silicon interface;

a metal gate region comprising a metal gate capacitively coupled to the channel so as to control the current, the metal gate including a conductive metal portion and a dielectric portion;

a molecular cluster thin film contacting the conductive metal portion of the metal gate region, the molecular cluster thin film being between the conductive metal portion and the dielectric portion of the first metal gate structure, the molecular cluster thin film comprising ionic clusters; and contacts to the positively-doped source region and the positively-doped drain region.

17. The p-type semiconductor device of claim 16 wherein the ionic clusters have a selected spatial orientation.

18. The p-type semiconductor device of claim 16 wherein the ionic clusters impart a compressive stress at the strained silicon interface in the channel.

19. A device, comprising:
a metal thin film, including a plurality of ionic clusters having a selected spatial orientation;
a semiconductor substrate;
a transistor on the semiconductor substrate, the transistor having a channel and a metal gate above the channel, the metal gate including a conductive metal material, the metal thin film being in contact with the conductive metal material of the metal gate of the transistor, the metal thin film being between the conductive metal material of the metal gate and the channel.

20. The device of claim 19 wherein a surface of the semiconductor substrate is electrically charged.

21. A device, comprising:
a substrate; and
a first transistor on the substrate, the first transistor including:
a first source;
a first drain;
a first metal gate structure that includes a conductive metal portion and a dielectric portion; and
a first molecular cluster thin film in contact with the conductive metal portion of the first metal gate structure, the first molecular cluster thin film being between the conductive metal portion and the dielectric portion of the first metal gate structure.

22. The device of claim 21 wherein the first transistor includes a channel that extends between the first source and first drain, the first metal gate structure being on the channel.

23. The device of claim 22 wherein the first molecular cluster thin film is in contact with a bottom surface and sides surfaces of the conductive metal portion of the first metal gate structure.

24. The device of claim 21, further comprising:
a second transistor on the substrate, the second transistor including:
a second source;
a source contact;
a second drain;
a drain contact;
a second metal gate structure;
a second molecular cluster thin film in contact with the source contact and is between the source contact and the second source; and
a third molecular cluster thin film in contact with the drain contact and is between the drain contact and the second drain.

25. The device of claim 24 wherein the second and third molecular cluster thin film include molecular clusters of the same structure.

26. The device of claim 24 wherein a structure of the first molecular cluster thin film is different from a structure of the second molecular cluster thin film.

* * * * *